United States Patent
Pace

(10) Patent No.: US 9,257,991 B2
(45) Date of Patent: Feb. 9, 2016

(54) HIGH-SPEED FREQUENCY DIVIDER

(71) Applicant: Telefonaktiebolaget L M Ericsson (publ), Stockholm (SE)

(72) Inventor: Ferdinando Pace, Birmensdorf (CH)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 199 days.

(21) Appl. No.: 14/160,201

(22) Filed: Jan. 21, 2014

(65) Prior Publication Data

US 2015/0207510 A1    Jul. 23, 2015

(51) Int. Cl.
*H03K 21/00* (2006.01)
*H03K 23/00* (2006.01)
*H03K 21/10* (2006.01)
*H03K 23/40* (2006.01)
*H03K 23/54* (2006.01)
*H03K 23/68* (2006.01)

(52) U.S. Cl.
CPC ............. *H03K 21/10* (2013.01); *H03K 23/40* (2013.01); *H03K 23/54* (2013.01); *H03K 23/68* (2013.01)

(58) Field of Classification Search
None
See application file for complete search history.

(56) References Cited

U.S. PATENT DOCUMENTS

| | | | | |
|---|---|---|---|---|
| 4,691,331 A * | 9/1987 | Bayruns et al. | ................. | 377/47 |
| 5,390,223 A * | 2/1995 | Lindholm | ........................ | 377/49 |
| 5,526,391 A * | 6/1996 | Shankar et al. | ................. | 377/47 |
| 5,946,369 A * | 8/1999 | Kolagotla et al. | ............. | 377/115 |
| 6,009,139 A * | 12/1999 | Austin et al. | ...................... | 377/47 |
| 6,459,310 B1 * | 10/2002 | Thomson et al. | ............. | 327/115 |
| 7,268,597 B2 * | 9/2007 | Miller, Jr. | ...................... | 327/117 |
| 8,693,616 B1 * | 4/2014 | Kho et al. | ......................... | 377/47 |
| 2006/0280278 A1 * | 12/2006 | Schabel et al. | .................. | 377/47 |
| 2010/0201409 A1 * | 8/2010 | Terada et al. | .................. | 327/117 |

* cited by examiner

*Primary Examiner* — Tuan T Lam
(74) *Attorney, Agent, or Firm* — Leffler Intellectual Property Law, PLLC

(57) ABSTRACT

A programmable high-speed frequency divider architecture is provided that is programmable to divide an input clock signal frequency by a selectable division N. The frequency divider architecture has a shift register circuit having N/2 shift register stages, connected in series when N is an even integer and trunc[N/2]+1 shift register stages when N is an odd integer. The frequency divider architecture includes a feedback logic circuit that performs a logical NAND of the output clock signal with the logical ORed result of a pre-output signal provided from a shift register stage prior to the output stage and another signal that indicates whether the selectable divisor N is odd or even.

17 Claims, 7 Drawing Sheets

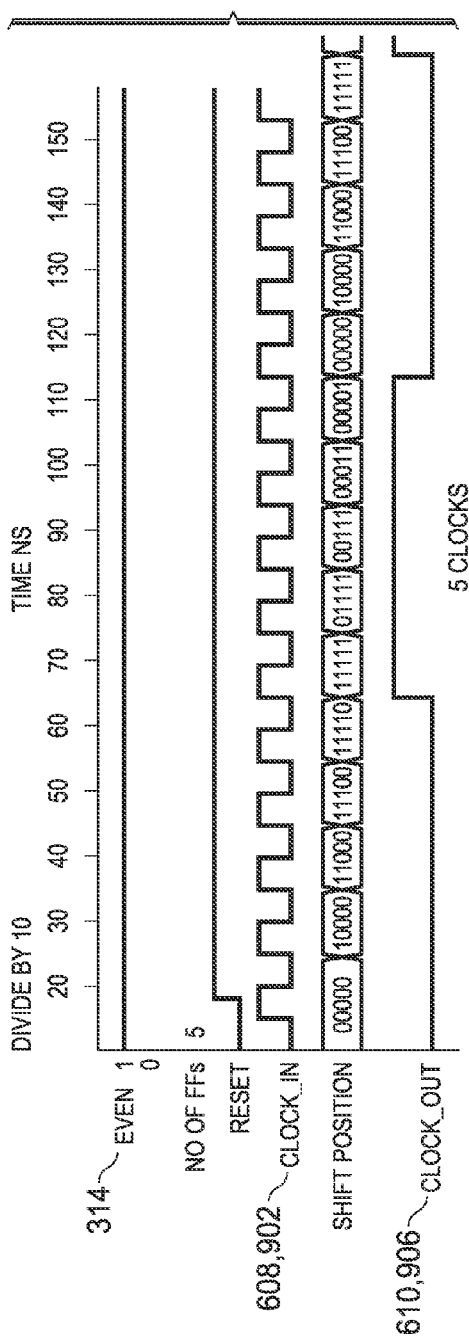
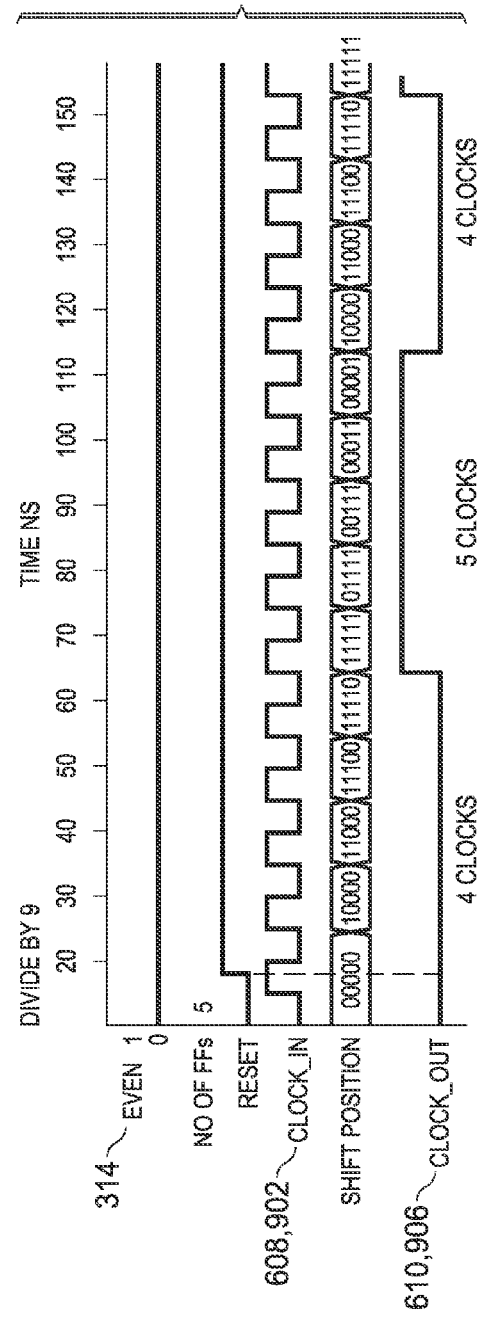

DECODER EXAMPLE FOR NUMBER OF FF> = 5

| DIVISION RATIO | MUX SELECTION DECODER M[4:0] | LOAD RESET VALUE DECODER 1. S[4:0] 2. R[4:0] |
|---|---|---|
| 2 | 11111 | 1. 00000<br>2. 111111 |
| 3 | 10000 | 1. 01100<br>2. 10011 |
| 4 | 11110 | 1. 00000<br>2. 111111 |
| 5 | 11100 | 1. 00000<br>2. 111111 |
| 6 | 11100 | 1. 00000<br>2. 111111 |
| 7 | 11000 | 1. 00000<br>2. 111111 |
| 8 | 11000 | 1. 00000<br>2. 111111 |
| 9 | 10000 | 1. 00000<br>2. 111111 |
| 10 | 10000 | 1. 00000<br>2. 111111 |

COMMENTS:
* ONLY DIVISION BY 3 REQUIRES A RESET VALUE DIFFERENT FROM 0
* IF DIVISION BY 3 NOT REQUIRED THERE IS NO NEED OF FF WITH ASYNC SET

FIG. 8

HIGH-SPEED FREQUENCY DIVIDER

TECHNICAL FIELD

Embodiments of the invention relate to a programmable frequency divider. Various embodiments of an exemplary programmable frequency divider are configurable for operation in a baseband processor or the transceiver circuitry of a mobile or wireless communication device.

BACKGROUND

Some modern transceiver circuitry used in, for example, mobile communication devices, requires clock signals of various frequencies from frequency division circuitry. For example, in the receiver portion of a transceiver, a local oscillator (LO) frequency is sometimes a division of a given reference frequency. A programmable frequency divider is often included in phase locked loop (PLL) circuits to generate a desired LO frequency. In the transmitter portion of the transceiver, a programmable frequency divider is sometimes included in transmission loops to help generate a necessary radio frequency (RF) or intermediate frequency (IF).

Referring to FIG. 1, a basic block diagram of a frequency divider 100 is provided. A clock-in signal 102 is input into the frequency divider 100. The DIV input 104 represents a desired division ratio. DIV is sometimes an array or vector of N+1 bits for indicating the division ratio. For example, to represent a division ratio ranging from 1 to 8, an array of 3 or more bits could be used. The load signal 106 is a signal used to load a state in the frequency divider 100 such that the proper division ratio of the clock-in signal 102 will be used. The clock-out signal 108 is the resulting divided down output signal.

FIG. 2 is a block diagram of a prior art frequency divider 200. The core of this frequency divider is a counter 202, which counts according to the division ratio set by the DIV input 204. The counter 202 counts the clock cycles of the clock input 206 to enable generation of a count waveform 208 that has a frequency equal to the frequency of the clock input 206 divided by the division ratio represented by DIV 204. The additional logic 210 handles both odd and even division ratios. Negative edges of the clock input 206 can be used in the processing of odd division ratios and provide a balanced 50/50 duty cycle clock output 212. If the division ratio, DIV 204 is "large", for example between 4 and 1024, then the complexity of the required counter block 202 is a substantial design limitation on the allowable maximum frequency of input clock 206. This is due to the logic in the counter 202 becoming more and more complex as the DIV number becomes increases, having a consequence of creating a critical delay time for the timing of the counter circuitry 202 for creation of the clock-out signal 212 with respect to the clock-in signal 206. It has been shown through computer analysis that when using CMOSO40 technology (CMOS-40 nm technology) the maximum frequency for the clock-in signal 206 is about 910 MHz when N equals 3 (and DIV=N+1=4) and the division ratio input 204 has a value that can range from 1 to 16. Creating high frequency division circuits with CMOS-40 nm technology using prior art counter-style frequency divider cannot provide high quality divided signals when the input frequency is above 910 MHz and/or operate with a division ratio greater than 16.

Thus, a problem that needs to be addressed is to resolve how to minimize the critical timing delay at a frequency divider circuit when the division ratio 204 is a "large" number. For example, if a clock-in signal 206 is at 910 MHz and N=3, then this prior art frequency divider will work properly. But, for example, if N=5 or more then the frequency division of this prior art frequency divider 200 becomes impossible because there is not enough set-up time for the flip-flop devices within the counter block 202 to operate correctly. Therefore, what is needed is a frequency division design that allows for programmable frequency division of a clock input such that whatever number is selected as the division ratio, substantially the same performance of the division aspect of the frequency division circuitry is provided regardless of how complex or large the division circuit becomes. Further, it would be advantageous to be able to provide a frequency divider device wherein the DIV (the division ratio) can be increased without limiting the maximum clock-in frequency.

Furthermore, what is needed is a frequency divider circuit that requires less circuitry to accomplish its frequency division function. Less circuitry often means requiring less space on an integrated circuit and less cost for design, debugging and production of the resulting integrated circuit device.

Additionally, it would be advantageous to provide such a high speed clock frequency divider architecture that can provide the 50% duty cycle clock-output when the division ratio is even integer and as near to a 50% duty cycle clock-output when the frequency division ratio is an odd integer.

SUMMARY

An embodiment of the invention provides a frequency divider circuit configured to receive an input clock signal having a first period and further configured to provide an output signal having a second period being a multiple, N, of the first period wherein N is an integer greater than or equal to 2. The exemplary frequency divider has a shift register architecture. The shift register architecture has a shift register circuit and a logic circuit. The shift register circuit comprises N/2 flip-flops (FFs) when N is even and trunc(N/2)+1 FFs when N is odd. The FFs are operatively connected to shift bits from a shift-in FF to a shift-out FF. Each of the FFs are configured to receive the input clock signal. The shift register architecture is also configured to provide the output signal from a shift-out FF output of the shift-out FF and a pre-output signal from a FF output of a FF prior to the shift-out FF in the shift register circuit. The logic circuit is configured to produce a loopback signal that is coupled to a shift-in FF input of the shift-in FF. The loopback signal is an operative result of a logical NAND of the output signal with an operative logical OR result of the pre-output signal and an even signal, wherein the when the even signal is at a first level the multiple of the first period is N and wherein when the even signal is at a second level the multiple of the first period is N−1.

In one embodiment, the first level of the even signal is a logical 1 and the second level of the even signal is a logical 0.

In yet another embodiment of the frequency divider, the FF output of the FF prior to the shift-out FF is a FFO_2 output of a FF_2 that is two FFs prior to the shift-out FF in the shift register circuit and wherein the logic circuit further comprises a loopback FF configured to receive the logical OR result and to delay the logical OR result one clock cycle prior to the logical NAND of the output signal with the logical OR result to produce the loopback signal.

In another embodiment of the frequency divider, a minimum number, N/2, of FFs in the shift register circuit is 3 and the minimum multiple, N−1, of the first period is 5.

In another embodiment of the frequency divider, the shift register circuit further comprises a multiplexer operatively connected to receive outputs from each prior FF in the shift register circuit prior to a predetermined FF in the shift register circuit and operatively connected to selectively provide one of the prior FF outputs to an input of the predetermined FF based on a selectable change of the number N.

In another embodiment of the frequency divider, the shift-out FF to the FF FF_(trunc(N/4)) are each configured to be operatively reset asynchronously with respect to the clock signal. Furthermore, the shift-in FF to the FF FF_(trunc((N/4)+1)) are configured to be operatively set asynchronously with respect to the clock signal.

In yet another embodiment, a frequency divider circuit is configured to receive an input clock signal having a first period and is also configured to provide an output signal having a second period having a maximum programmable multiple A of the first period, where A is an even integer greater or equal to 4. The frequency divider circuit comprises a shift register circuit. The shift register circuit comprises a set of A/2 shift register stages {S_j} connected in series. Each stage comprises a stage multiplexer M_i and stage FF F_i, an output MO_i of each stage multiplexer is coupled to an input FFI_i of the corresponding stage FF FF_i. An output FFO_i of each stage FF FF_i is coupled to a first input MI1_i−1 of stage multiplexer M_i−1 in an immediately following stage S_j−1, wherein j=i+1. The frequency divider further comprises a feedback logic circuit. The feedback logic circuit is coupled to receive a FFO_0 of FF FF_0, of stage S_1, a MO_1 of M_1 of stage S_2, FFO_3 of FF_3 and an even signal. The feedback logic circuit operatively provides a loopback signal, which is coupled to a second input MI2_i of each multiplexer M_i of each stage S_j. The loopback signal is a logical NAND result of the FFO_0 with an operative logical OR result of the MO_1 and the even signal. When the even signal is at a first level the selected multiple N of the first period is an even multiple and when the even signal is at a second level the selected multiple N of the first period is an odd multiple. The selected multiple N is an integer, wherein A≥N≥2. The output signal is operatively output from the FFO_0 of stage S_1.

In another frequency divider circuit, there is also a multiplexer selection decoder configured to provide each stage multiplexer M_i a selection signal for selecting between the stage multiplexer output signal MO_i that corresponds to the loopback signal or to a previous stage's FF output (FFO_i+1). The selection signal is dependent on the multiple N and the even signal.

In another embodiment of the frequency divider, the decoder is configured to select the loopback signal to be output from the multiplexer output MO_N/2 when N is even and the even signal at the first level. The decoder is further configured to select the loopback signal to be output from the multiplexer output MO_trunc(N/2)+1 when N is odd and the even signal is at the second level.

In various embodiments of the frequency divider, each stage FF FF_i is operatively configured to be clocked and positive edge triggered by the input clock signal.

In yet another embodiment of the frequency divider, the feedback logic circuit operatively delays the operative logical OR result signal by one clock cycle of the input clock signal.

In an embodiment of the frequency divider, a load reset value decoder is provided and operatively responsive to a reset signal. Upon receipt of the reset signal, the load reset value decoder loads a predetermined reset value into each FF FF_i of each shift register stage S_j depending on the multiple N.

In an embodiment of the frequency divider, the duty cycle of the output signal is 50% when the selected multiple N is even and is [trunc(N/2)/N](100)% when the selected multiple N is odd.

In yet another embodiment, a method for frequency dividing an input clock signal having a first cycle period to provide an output clock signal having a second cycle period that is a programmable multiple N of the first cycle period is provided. The method comprises receiving, by a shift register circuit, the input clock signal and producing an output signal from an output FF of the shift register circuit. The shift register comprises a plurality of stages S_j coupled in series. A feedback logic circuit receives the output signal, a pre-output signal operatively output from a predetermined stage S_(predetermined) previous to the output FF in the shift register circuit, and an even signal indicative of whether the programmable multiple N is odd or even. Then, a loopback signal is produced that is a logical NAND result of the output signal with a logical OR result of the pre-output signal and the even signal. Then the feedback logic circuit provides the loopback signal to a selected FF input of the shift register circuit, wherein the selection of the FF input is based on the programmable multiple N.

In another embodiment method, the number of FFs used in the shift register circuit is equal to N/2 when the selected multiple N is an even number and equal to trunc(N/2)+1 when the selected multiple N is an odd number.

In another embodiment method, each stage of the shift register circuit comprises a FF and the method further comprises loading each FF of each stage with a value upon receipt of a reset signal, the value being determined by the selected multiple N.

BRIEF DESCRIPTION OF THE DRAWINGS

For a more complete understanding, reference is now made to the following description taken in conjunction with the accompanying drawings in which:

FIG. 3 depicts a timing diagram for the exemplary frequency divider architecture of FIGS. 5 and 9 when operating in a divide by 10 mode;

FIG. 4 depicts a timing diagram for the exemplary frequency divider architecture of FIGS. 5 and 9 when operating in a divide by 9 mode;

FIG. 8 is a chart providing exemplary multiplexer and load reset values for a 5 stage frequency divider of FIG. 7.

DETAILED DESCRIPTION

Figure 1:
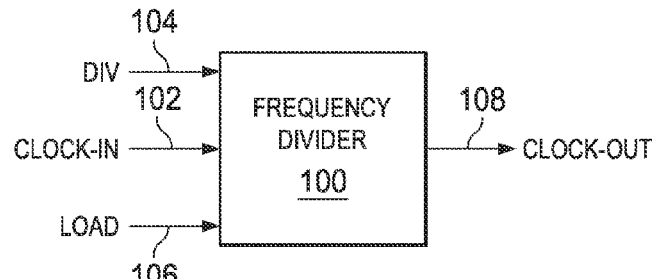
FIG. 1 depicts a basic block diagram of a frequency divider.
Figure 2:
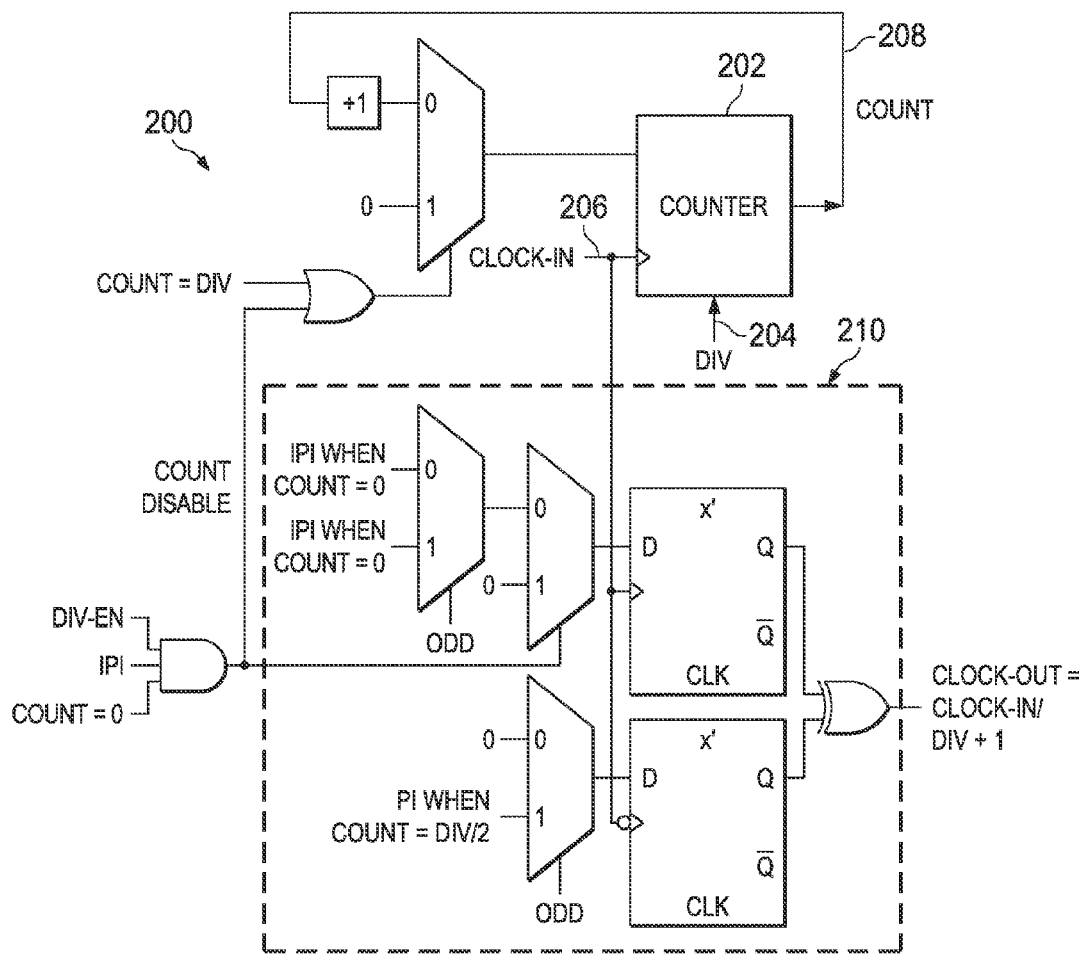
FIG. 2 depicts a block diagram of a prior art counter-style frequency divider.

Referring now to the drawings, wherein like reference numbers are used herein to designate like elements throughout, the various views and embodiments of high speed frequency divider are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Embodiments of an exemplary programmable high speed digital divider architecture are used to divide the frequency of an input clock signal down to one or more frequencies that are required by other circuits within, for example, a mobile or wireless communication device. The input clock signal may have a clock frequency of up to about 3 GHz. Embodiments of an invention may be incorporated into a baseband processor IC, where frequencies (clock frequencies) that are to be used for different subsystems or circuit blocks within the IC need to be derived from one or more common, high speed clock frequency sources, such as a PLL (phase-locked loop) having frequencies greater than 1 GHz.

Various embodiments of a programmable high speed divider architecture divide a clock frequency by a selectable division ratio N, where N can be either an odd or even integer. Additionally, embodiments provide a reduced circuit size wherein the number of FFs (flip-flops) required by an exemplary high speed divider architecture is equal to N/2 when N is an even integer. More specifically, the number of flip-flops necessary in an exemplary high speed divider architecture when N is an even integer is equal to N/2. For example, when N, the division ratio, is 10, then the number of flip-flips necessary in an exemplary frequency divider architecture is equal to 10/2 or 5 flip-flops. Alternatively, when the division ratio is an odd integer, the number of flip-flops necessary in an exemplary frequency divider architecture is trunc(N/2)+1. For example, when the division ratio, N, is 9, then the number of flip-flops necessary in an exemplary digital frequency divider to perform the division ratio function is equal to 4+1=5 flip-flops.

Exemplary frequency divider architectures provide an output clock signal duty cycle of 50% when the division ratio, N, is even. Conversely, when N is odd, the output signal duty cycle is [trunc(N/2)+1]/N. For example, when N is 9, the duty cycle of an output signal produced by an embodiment is equal to [4+1]/9=5/9, which equals to 55.56%.

There are various advantages to the exemplary frequency divider architecture embodiments. In order to operate with high input clock signal frequencies of up to about 3 GHz, only a minimal logic gate delay (e.g., a maximum delay of an OR-gate-delay and a NAND-gate-delay) limits a maximum input clock frequency or delay thereof. Also, a maximum input clock frequency of an exemplary frequency divider architecture is not limited based on the division ratio, N, selected. Furthermore, the circuit area size of an exemplary frequency divider is reduced. An additional advantage of the exemplary frequency divider architecture is that it can be implemented using standard cell flip-flops from existing technology. Thus, implementation of the exemplary frequency divider circuitry does not require the design of new, complex specialized analog or digital circuitry or cells for incorporation into integrated circuits.

It should also be understood that when the division ratio, N, is used to indicate how the input clock frequency is being divided so as to produce an output clock signal, it also follows that the division ratio, N, is also a clock cycle period multiplier which multiplies the period of 1 cycle of the input clock frequency by the multiplier, N, to produce an output signal having a period that is N times larger than the period of the input clock signal.

Figure 5:
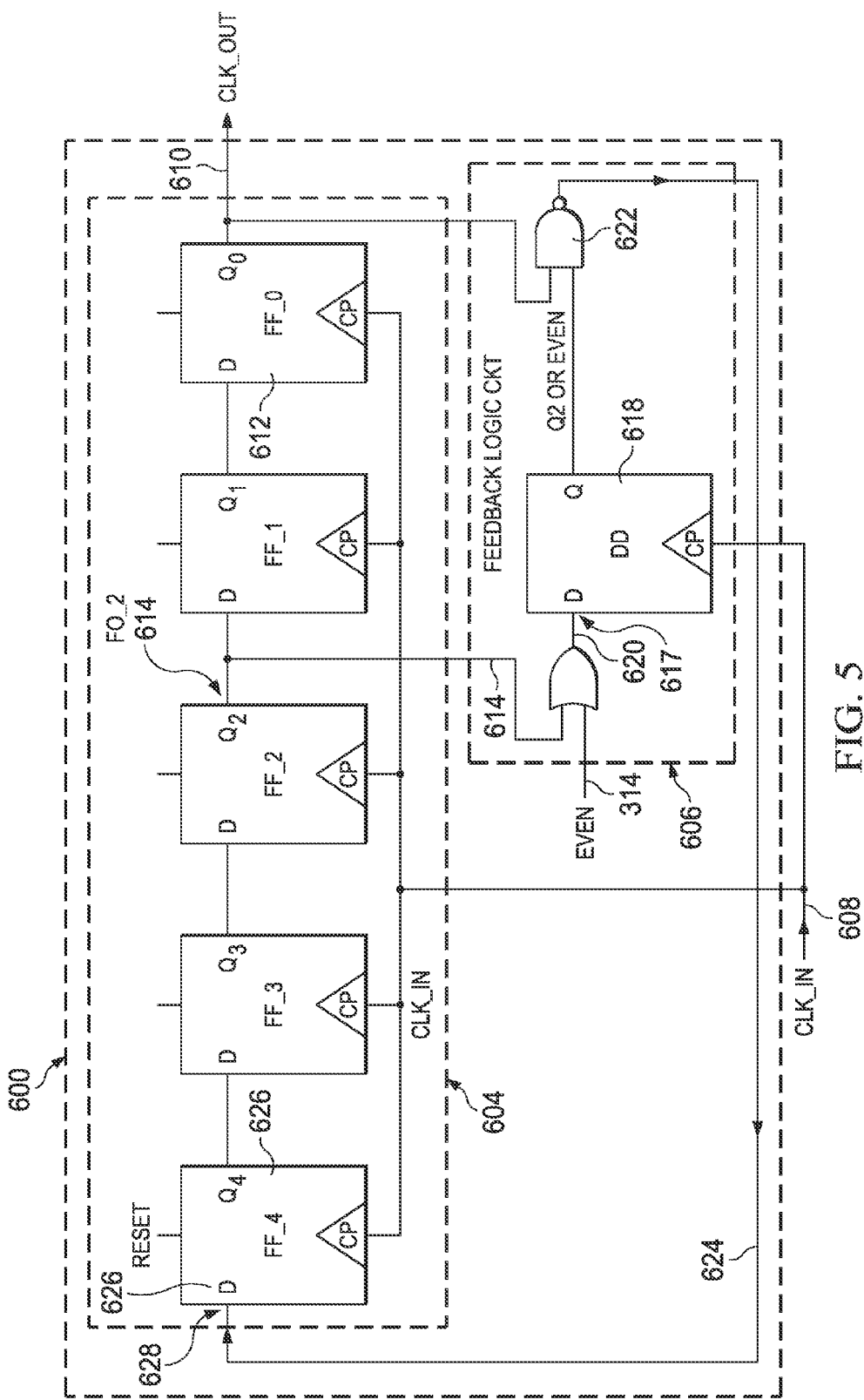
FIG. 5 is another exemplary frequency divider architecture programmable to divide an input clock signal by 9 or 10.

Referring now to FIG. 5, an exemplary frequency divider architecture 600 is depicted. This architecture has a shift register circuit 604 and a feedback logic circuit 606. An input clock 608 is provided to clock each of the serially connected flip-flops FF_i making the shift register circuit 604. An output clock signal 610 is provided from an output Q0 of the shift-out flip-flop 612, also referred to as FF_0. A pre-output signal Q2 is output from a flip-flop output of a flip-flop that is prior to the shift-out flip-flop 612 in the shift register circuit 604. In this embodiment, the pre-output signal 614 is provided from the output FFO_2 of the flip-flop FF_2.

Although embodiments of this exemplary frequency divider 600 have a minimum division ratio, N, equal to 5, the maximum frequency division ratio N, can be a very large number without limiting the maximum input clock frequency allowable. The number of flip-flops in the set of flip-flops FF_i is equal to the division ratio divided by 2, N/2, for even numbers or trunc(N/2)+1 if the desired maximum division ratio, N, of the clock input frequency is an odd number.

The feedback logic circuit 606 comprises a loopback flip-flop 618. The loopback flip-flop 618 is clocked on the input clock signal 608. The loopback flip-flop 618 effectively places a one clock cycle delay in the pre-output signal 614 within the feedback logic circuit 606. The pre-output signal 614 is ORed with the "even" signal 314 and then provided to the input 617 of the loopback flip-flop 618. After one clock cycle, the logical ORed result 620 is output from the loopback flip-flop 618 and logically NANDed with the Q0 or clock output signal 610 via a logical NAND circuit 622. The output of the NAND circuit 622 is then provided as the loopback signal 624. The loopback signal 624 is coupled so as to be input into the shift-in flip-flop 626 of the shift register circuit 604. The input of the shift-in flip-flop is FFI_4 628 of the flip-flop FF_4. In this embodiment, the loopback flip-flop 618 stabilizes the overall timing of an exemplary frequency divider 600 as it operates at higher and higher frequencies of up to about 3 GHz.

In this embodiment and similar embodiments having a different number of flip-flops in the shift register circuit 604, the flip-flops from FF_0 to FF_trunc(number of FFs in the shift register/2)−1 will have an asynchronous reset. Additionally, the flip-flops from FF_trunc(number of FFs in the shift register circuit/2) to the total number of flip-flops, will have an asynchronous set. Thus, for example, referring to FIG. 5, upon a reset signal, the flip-flops FF_0 through FF_1 will be loaded with 0 and the remaining flip-flops, FF_2 through FF_4, will be loaded with 1s. FIGS. 3 and 4 show a timing diagram indicating that, upon receipt of a reset signal, the shift register circuit 604 is loaded with 11100.**

Referring now to FIGS. 3, 4, and 5, one can see that, after the reset signal goes high, on each rising edge of the clock input signal 608 the output of the feedback logic circuit 606 is input into the shift-in flip-flop input FFI_4 628 of flip-flop FF_4. In the FIG. 3 divide by 10 timing diagram, it is seen that when the "even" signal is a 1, the exemplary configuration will divide the input clock signal frequency by 10 (i.e., multiply the clock cycle period by 10). Furthermore, in FIG. 4, when the "even" signal 314 is 0, then the input clock signal frequency is divided by 9, as shown by the output clock signal 610.

Additionally, when the division ratio N, is equal to an even number such as 10, FIG. 3 indicates that the output clock signal 610 has a clock period duty cycle of 50%. Alternatively, when N is an odd number such as 9, FIG. 4 depicts that the duty cycle of the output clock signal 610 is equal to [trunc(N/2)+1]/N. In this example with N equal to 9, the duty cycle is equal to 5/9ths or 55.56%.

In this embodiment of FIG. 5, the reset signal provided to each of the shift register flip-flops FF_i in the shift register circuit 604 can reset the shift registers so that they are all 0s.

This embodiment is programmable for a division ratio of N equal to 9 or 10 with N/2=5 flip-flops in the shift register circuit 604.

Figure 6:
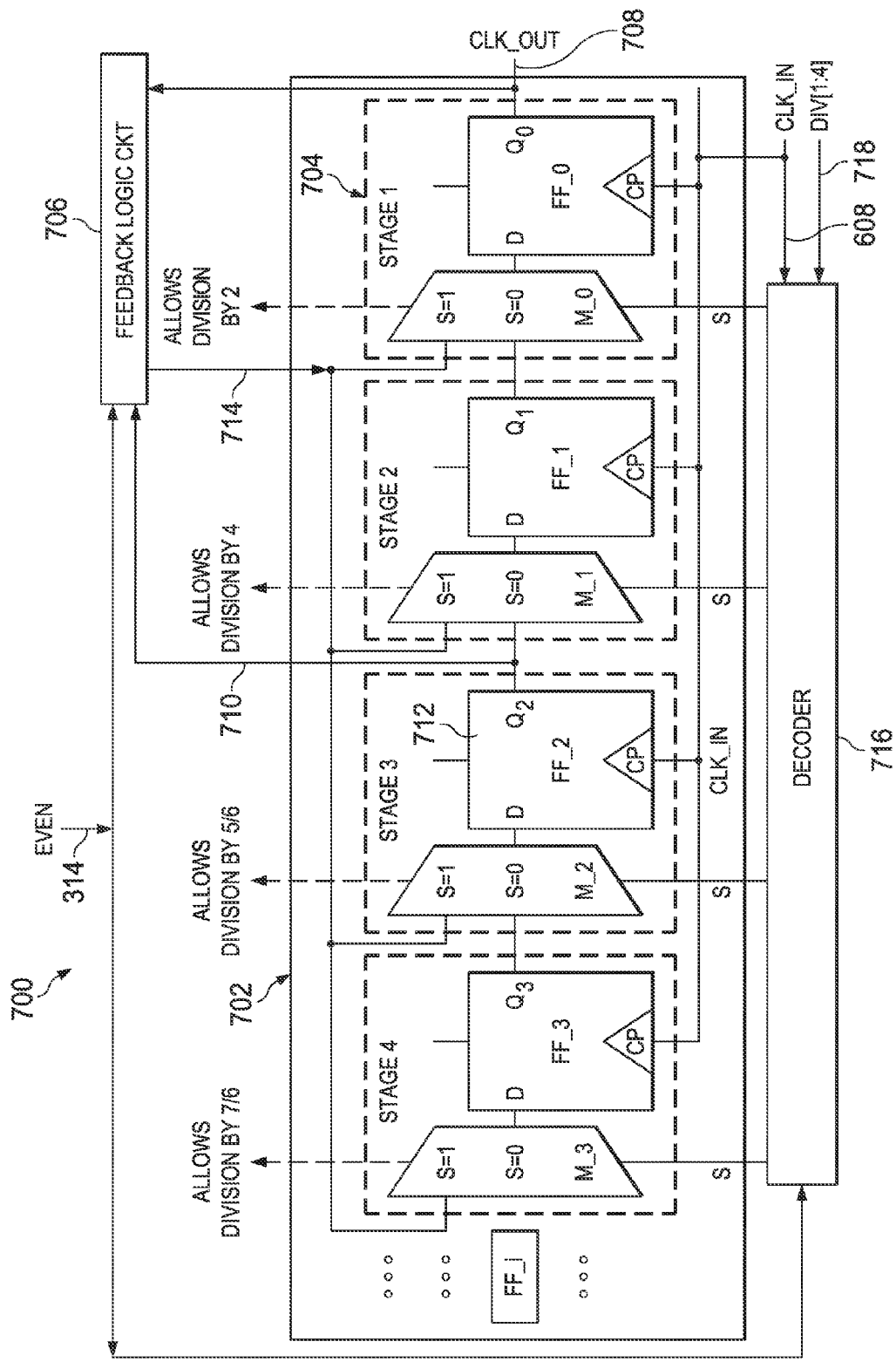
FIG. 6 is an exemplary frequency divider architecture that is programmable to allow frequency division of an input clock frequency by 2 and 4-8.

Referring now to FIG. 6, another exemplary frequency divider architecture that is programmable to allow frequency division of the input clock signal 608 by 2 or by 4, 5, 6, 7, or 8. It is also understood that embodiments of the invention can also be provided with additional shift register stages S_j so as to frequency divide an input clock frequency by integers larger than 8. Here, the frequency divider circuit 700 had a shift register circuit 702 that has a set of shift register stages S_j connected in series. The frequency divider circuit 700 is programmable to divide an input clock signal frequency by a number, N, where N is an integer that is less than or equal to a maximum division ratio, A. The number of stages S_j is equal to A/2 wherein A is an even integer and j=i+1.

Each shift register stage S_j, of the shift register circuit 702 has a stage multiplexer M_i and a stage flip-flop FF_i (where j=i+1). The stage multiplexer M_i is coupled to an input FFI_i of the corresponding stage flip-flop FF_i. For every stage, except for the first stage S_1 stage 704, the output FFO_i of each stage flip-flop FF_i is coupled to a first input MI1≤i−1 of the stage multiplexer M_i−1 in an immediately following stage S_j−1 in the shift register circuit 702.

Feedback logic circuit 706, which is substantially similar or equivalent to the feedback logic circuit 606 of FIG. 5, receives the output clock signal 708 of the first stage 704, which is the Q0 output of flip-flop FF_0 (i.e., the output FFO_0 of flip-flop FF_0). The feedback logic circuit 706 also receives the flip-flop output FFO_2 710 of the stage 3 S_3 flip-flop 712. Additionally, the feedback logic circuit 706 receives an "even" signal 314, which programs the exemplary multistage programmable frequency divider to divide by either an even or an odd number for the number of stages N/2 that a programmably selected to be active. The feedback logic circuit 706 provides a loopback signal 714, which is selectively looped back to the shift register circuit 702 via the multiplexer M_i of each stage S_j in the shift register circuit 702.

A decoder circuit, which also receives the input clock signal 608 and the division number, N, 718, sets the multiplexers M_i of each stage S_j to either shift the bit of the prior stage S_j+1 flip-flop output FFO_i+1 or shift the loopback signal 714 to the flip-flop input FFI_i of flip-flop FF_i. The decoder 716 further receives the "even" signal. Using the "even" signal 314 and the division ratio signal 718, the decoder 716 sets the multiplexer M_i of each stage S_j to either loopback the loopback signal 714 or shift the contents of the previous stage's flip-flop contents to the next flip-flop (FF_i−1) in the shift register circuit. As such, the loopback signal can be sent to stage 1 704 to allow the input clock signal 608 to be divided by 2 in order to provide the output clock signal 708. If only stages 1 and 2 are used in the shift register circuit such that the loopback signal 714 is looped back into the multiplexer of stage 2 then, in this embodiment, the input clock signal frequency can be divided by 4 to produce an output clock signal 708. Additionally, if the decoder 716 is set by the division signal 718 for a division ratio of 5 or 6, the loopback signal 714 will be selected by the decoder 716 to loop back through the stage 3 multiplexer M_2 of the shift register circuit 702. Depending on whether the division, N, is 6 or 5 the "even" signal 314 is a 1 or a 0 such that the input clock signal 608 will be divided by 6 or 5, respectively to produce the output clock signal 708. If the division ratio is 7 or 8, 4 stages of the frequency division circuit 700 will be used such that the loopback signal 714 is looped back through the multiplexer M_3 in stage 4 of the shift register circuit while the remaining multiplexers in stages 3, 2, and 1 are set to shift the output of the previous stage flip-flop into the input of the next stage flip-flop so that the input clock frequency is divided by 8 or 7, depending on whether the "even" signal 314 is set to a 1 or 0, respectively. As can be seen, this embodiment of a frequency division circuit can be programmed to divide by all division ratios, N, equal or greater to 2 except for N=3.

Figure 7:
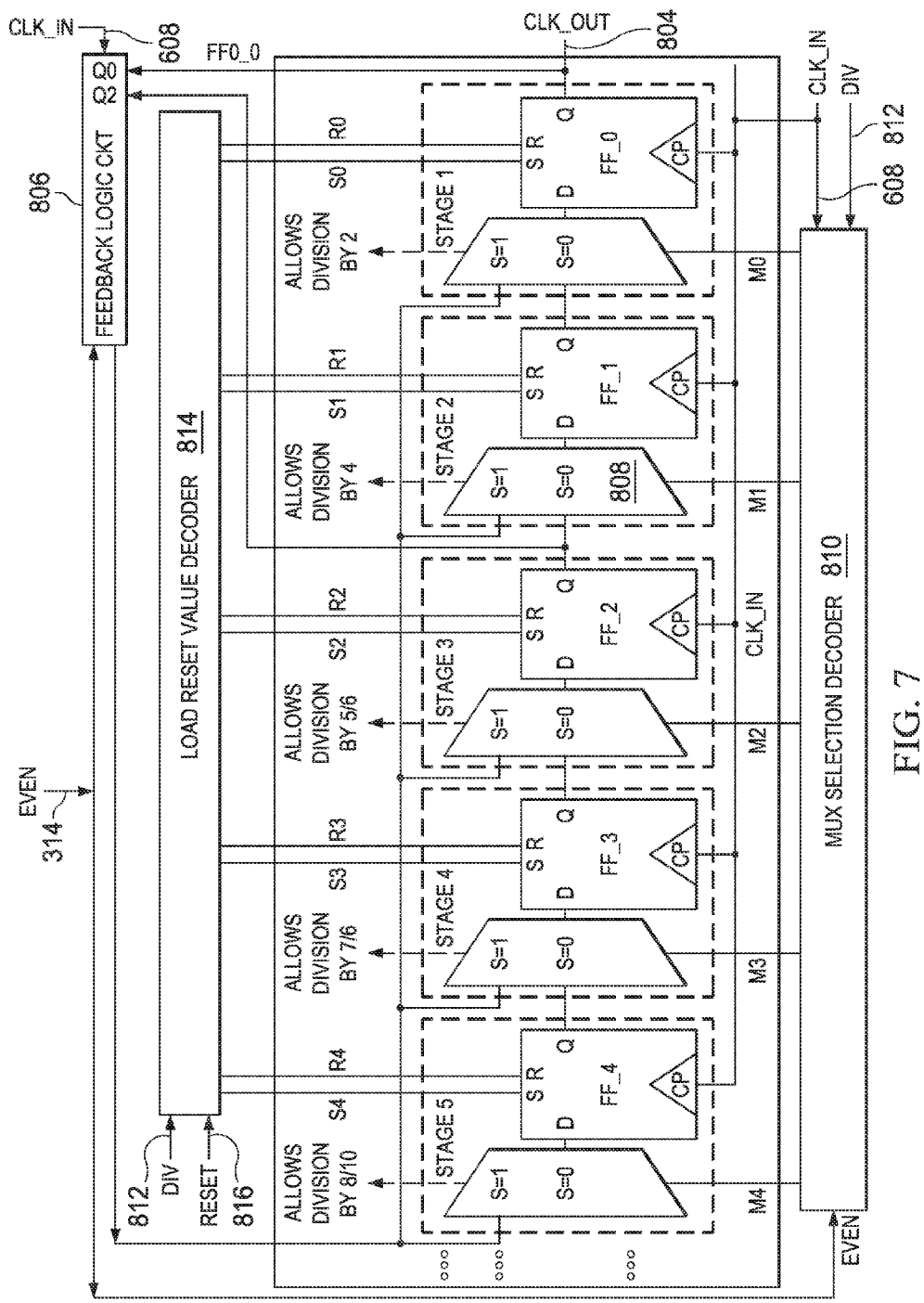
FIG. 7 is an exemplary frequency divider architecture that is programmable to allow frequency division of an input clock frequency by substantially any integer number.

Referring now to FIGS. 7 and 8, another exemplary programmable frequency divider 800 is depicted. There is an exemplary multistage S_j shift register circuit 802 having 5 stages. Depending on the maximum programmable frequency division (or maximum cycle period multiplication), A, of the input clock signal 608, there is a set of A/2 shift register stages S_j. Each stage S_j has a multiplexer M_i and stage flip-flop FF_i wherein an output MO_i of each stage multiplexer is coupled to an input FFI_i of the corresponding stages flip-flop FF_i (where j=i+1). The output FFO_0 of the stage 1 flip-flop FF_0 provides the output clock signal 804, which is also provided as an input to the feedback logic circuit 806. The feedback logic circuit 806 also receives the output MO_1 of the stage 2 multiplexer M_1 808 as well as an even signal 314 and the input clock signal 608. In the various embodiments, the feedback logic circuit 706 and 806 are substantially the same or equivalent to the feedback logic circuit 606, shown in FIG. 5. A multiplexer selection decoder 810 sets the multiplexers M_0 through M_4 in stages 1 through 5 respectively in accordance with division ratio, N, provided by the division signal 812 and the even signal 314. FIG. 8 indicates the output of the multiplexer selection decoder outputs M0 through M4 for a selected programmable division ratio, N.

A load reset value decoder 814 sets S0 through S4 or resets R0 through R4 for each flip-flop FF_i of each stage S_j as shown in the load reset value decoder column of FIG. 8 for each division ratio when the reset signal is active. It should be noted that for an input clock division ratio of 3 (i.e., an input clock cycle period multiplication of 3) the multiplexer selection decoder output and load reset value decoder 810, 814 put are set so as to provide a 01100 pattern that shifts throughout the entire 5 stages of the exemplary multi-stage shift register 802 when it has 5 stages. If a division of 3 is not required, then there is no need for any of the flip-flops FF_i in any of the shift register stages 1 through 5 to have an asynchronous set connection between the flip-flop FF_i and the load reset value decoder 814. As such, in this embodiment, any division value of N from 2 to 10 can be accomplished with an exemplary 5 stage embodiment of the programmable frequency divider circuit 800. For a programmable frequency divider in accordance with this embodiment, the maximum division ratio A, for the input clock signal 608 requires a number of shift register stages equal to A/2 when the maximum division ratio is an even number and the number of shift register stages to be equal to trunc(A/2)+1 when the maximum frequency division ratio, A, is an odd number.

Figure 9:
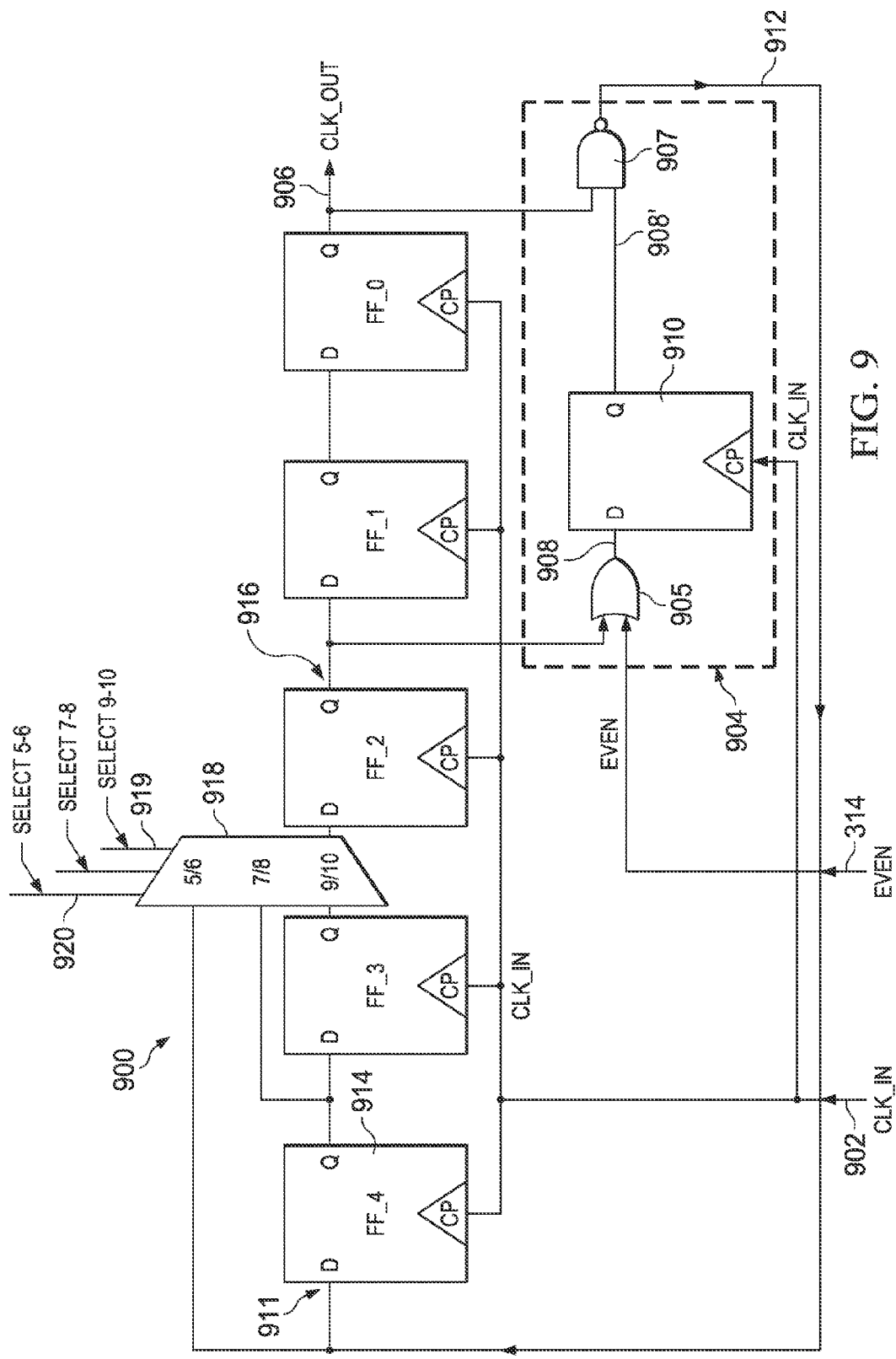
FIG. 9 is another exemplary frequency divider architecture having a concentrated multiplexer.

FIG. 9 is yet another exemplary frequency divider architecture 900 that requires a single concentrated multiplexer 918, rather than a two input multiplexer in each stage of the shift register circuit. Here, the programmable frequency divider 900 comprises a shift register circuit having shift registers FF_0 through FF_4 with a total of 5 shift registers. It is understood that other embodiments may have more or less flip-flops within the programmable frequency divider shift register circuit. An input clock signal 902 is provided to clock each of the shift registers FF_i in the shift register circuit. The feedback logic circuit 904 includes an OR gate 905 which logically ORs the even signal 314 with the output FFO_2 916 of the flip-flop FF_2, which is a flip-flop that is previous to the FF_0 flip-flop within the shift register circuit. The logical ORed result 908 is provided to the input of a feedback logic flip-flop 910 and delayed by one clock cycle via the input clock signal 902. The delayed logical ORed result 908' is then logically NANDed 907 with the output FFO_0 of the flip-flop FF_0 906 (i.e., the output clock signal). As a result, the feedback logic circuit 904 provides a loopback signal 912 that is provided to the input 911 of the shift-in flip-flop 914 (i.e., the input FFI_4 of flip-flop FF_4 914). The loopback signal 912 is also provided as an input to one of a plurality of inputs of a multi-input multiplexer 918. The output of the FF_4 914 is provided to both an input to the flip-flop FF_3 and another input of the multi-input MUX multiplexer 918. The flip-flop FF_3 also provides an output to the multi-input multiplexer 918. The output of the multi-input multiplexer 918 is then provided to the flip-flop FF_2.

When, for example, N, the division ratio, is set to 10, then the select line 9-10 919 will be set to a 1 and the even signal 314 will also be set to a 1. As a result, the loopback signal 912 will be looped back through the shift-in flip-flop FF_4 914 and then through FF_3, FF_2, FF_1, and FF_0 respectively on each clock cycle to produce the output clock signal 906 in a similar fashion as depicted in the timing diagram of FIG. 4. Alternatively, if the division ratio, N, is set to 5, then the select 5-6 line 920 will be set to a 1 and the loopback signal 912 will be provided to an input of the multi-input multiplexer 918 and output from the MUX to the input FFI_2 of flip-flop FF_2 while the even signal 314 is set to a 0. With this configuration, the exemplary programmable frequency divider 900 can be used to divide an input clock frequency 902 by any number between 5 and 10 using only 5 flip-flops in a shift register circuit with a single multi-input multiplexer 918, thereby enabling a programmable frequency divider in accordance with this embodiment to operate at frequencies up to and about 3 GHz.

The reset value for each flip-flop FF_0 through FF_4 in the shift register circuit can be 00000. It also should be understood that, as the multiplexer 918 gets more inputs due to a larger number of flip-flops FF_i in the shift register circuit, it may become the factor for the maximum input clock frequency 902 due to the additional signal delay time added by the complexity of a more complex multiple input multiplexer. As with the previous embodiments, the output duty cycle in this embodiment depicted in FIG. 10 is 50% for division ratios, N, that are even. The duty cycle of the output clock signal will be [trunc(N/2)+1]/N(100)% if the division ratio, N, is an odd integer.

Exemplary frequency division architectures provide a reduced circuit size wherein the number of flip-flops required by an exemplary high speed divider architecture is equal to N/2. More specifically, the number of flip-flops necessary in an exemplary divider architecture when N is an even integer is equal to N/2. Alternatively, when the division ratio is an odd integer, the number of flip-flops necessary in an exemplary frequency divider architecture is trunc(N/2)+1. The various frequency divider architectures disclosed operate with a very high input clock frequency of up to about 3 GHz due to there being a minimal logic gate delay (i.e., a maximum delay of an OR-gate-delay and a NAND-gate-delay) limiting the maximum input clock frequency. Additionally, the maximum input clock frequency of an exemplary frequency divider architecture is not limited due to the particular frequency division ratio selected. Ultimately, embodiments of the present invention provide a frequency divider circuit that has a reduced circuit area size.

It should be understood that the drawings and detailed description herein are to be regarded in an illustrative rather than a restrictive manner, and are not to be limiting to the particular forms and examples disclosed. On the contrary, included are any further modifications, changes, rearrangements, substitutions, alternatives, design choices, and embodiments apparent to those of ordinary skill in the art, without departing from the underlying design and scope hereof, as defined by the following claims. Thus, it is intended that the following claims be interpreted to embrace all such further modifications, changes, rearrangements, substitutions, alternatives, design choices, and embodiments.

It will be appreciated by those skilled in the art having the benefit of this disclosure that the drawings and detailed description herein are to be regarded in an illustrative, not restrictive, manner, not to be taken as limiting the scope of protection to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments that are obvious to the person skilled in the art in view of the present disclosure.

What is claimed is:

1. A frequency divider circuit configured to receive an input clock signal having a first period and configured to provide an output signal having a second period being a multiple, N, of the first period wherein N is an integer greater than or equal to 2, the frequency divider circuit comprising:
    a shift register architecture comprising:
        a shift register circuit comprising M flip-flops (FF), where M is N/2 when N is even and M is trunc(N/2)+1 when N is odd, the FFs operatively connected to shift bits from a shift-in FF, FF_i, of the FFs to a shift-out FF, FF_0, of the FFs, each of the FFs configured to receive the input clock signal; the shift register architecture configured to provide the output signal from a shift-out FF output of the shift-out FF, FF_0, and a pre-output signal from a FF output of a FF preceding the shift-out FF in the shift register circuit;
        a logic circuit configured to produce a loopback signal that is coupled to a shift-in FF input of the shift-in FF, the loopback signal is an operative result of a logical NAND of the output signal from the shift-out FF output with an operative logical OR result of the pre-output signal and an "even" signal, wherein when the "even" signal is at a first level the multiple of the first period is N and wherein when the "even" signal is at a second level different from the first level the multiple of the first period is N−1.

2. The frequency divider circuit of claim 1, wherein the first level of the "even" signal represents a logical 1 and wherein the second level of the "even" signal represents a logical 0.

3. The frequency divider of claim 1, wherein the FF output of the FF preceding the shift-out FF is an output, FFO_1, of a FF, FF_1, immediately preceding the shift-out FF in the shift register circuit.

4. The frequency divider of claim 1, wherein the FF output of the FF preceding the shift-out FF is an output, FFO_2, of a FF, FF_2, that immediately precedes a FF that immediately precedes the shift-out FF in the shift register circuit and wherein the logic circuit further comprises a loopback FF configured to receive the logical OR result and to delay the logical OR result one clock cycle prior to the logical NAND.

5. The frequency divider of claim 4, wherein a minimum number, N/2, of FFs in the shift register circuit is 3 and the minimum multiple, N−1, of the first period is 5.

6. The frequency divider of claim 4, wherein the shift register circuit further comprises a multiplexer operatively connected to receive outputs from each prior FF in the shift register circuit prior to a predetermined FF in the shift register circuit and operatively connected to selectively provide one of the prior FF outputs to an input of the predetermined FF based on a selectable change of the number N.

7. A frequency divider circuit configured to receive an input clock signal having a first period and configured to provide an output signal having a second period having a maximum programmable multiple A of the first period, where A is an even integer greater or equal to 4, the frequency divider circuit comprising:
   a shift register circuit comprising:
      a set of A/2 shift register stages {S_j} connected in series, each stage comprising a stage multiplexer M_i and stage flip-flop (FF) F_i, an output MO_i of each stage multiplexer coupled to an input FFI_i of the corresponding stage FF FF_i, an output FFO_i of each stage FF FF_i coupled to a first input MI1_i−1 of stage multiplexer M_i−1 in an immediately following stage S_j−1, wherein j=i+1;
      a feedback logic circuit coupled to receive a FFO_0 of FF FF_0, of stage S_1, a MO_1 of M_1 of stage S_2, FFO_2 of FF_2 and an "even" signal, the feedback logic circuit operatively providing a loopback signal, the loopback signal being coupled to a second input MI2_i of each multiplexer M_i of each stage, the loopback signal being a logical NAND result of the FFO_0 with an operative logical OR result of the MO_1 and the "even" signal;
      wherein when the "even" signal is at a first level the selected multiple N of the first period is an "even" multiple;
      wherein when the "even" signal is at a second level the selected multiple N of the first period is an odd multiple, the selected multiple N being an integer, wherein A≥N≥2; and
      wherein the output signal is operatively output from the FFO_0 of stage S_1.

8. The frequency divider of claim 7, further comprising a multiplexer selection decoder configured to provide each stage multiplexer M_i a selection signal for selecting between the stage multiplexer output signal MO_i corresponding to the loopback signal or a previous stage's FF output, FFO_i+1, the selection signal being dependent on the multiple N and the "even" signal.

9. The frequency divider of claim 8, wherein the decoder is configured to select the loopback signal to be output from multiplexer output MO_N/2 when N is even and the "even" signal at the first level, and wherein the decoder is configured to select the loopback signal to be output from the multiplexer output MO_trunc(N/2)+1 when N is odd and the "even" signal is at the second level.

10. The frequency divider of claim 7, wherein the first level of the "even" signal represents a logical 1 and wherein the second level of the "even" signal represents a logical 0.

11. The frequency divider of claim 8, wherein each stage FF FF_i is operatively configured to all be positively edge triggered or all be negatively edge triggered by the input clock signal.

12. The frequency divider of claim 7, wherein the feedback logic circuit operatively delays the operative logical OR result signal by one clock cycle of the input clock signal.

13. The frequency divider of claim 7, further comprising a load reset value decoder operatively responsive to a reset signal to load a predetermined reset value into each FF FF_i of each shift register stage depending on the multiple N.

14. The frequency divider of claim 13, wherein the predetermined reset value is the same for all values of the selected multiple N except N=3.

15. A method for frequency dividing an input clock signal having a first cycle period to provide an output clock signal having a second cycle period that is a programmable multiple N of the first cycle period, the method comprising:
   receiving, by a shift register circuit, the input clock signal and producing an output signal from an output FF of the shift register circuit, the shift register comprising a plurality of stages S_j coupled in series;
   receiving, by a feedback logic circuit, the output signal, a pre-output signal operatively output from a predetermined stage S_(predetermined) previous to the output FF in the shift register circuit, and an "even" signal indicative of whether the programmable multiple N is odd or even;
   producing a loopback signal that is a logical NAND result of the output signal with a logical OR result of the pre-output signal and the "even" signal;
   providing, by the feedback logic circuit, the loopback signal to a selected FF input of the shift register circuit, the selection of the FF input being based on the programmable multiple N.

16. The method of claim 15, wherein the number of FFs used in the shift register circuit is equal to N/2 when the selected multiple N is an even number and equal to trunc(N/2)+1 when the selected multiple N is an odd number.

17. The method of claim 16, wherein each stage of the shift register circuit comprises a FF and wherein the method further comprises loading each FF of each stage with a value upon receipt of a reset signal, the value being determined by the selected multiple N.

\* \* \* \* \*